United States Patent
Wang et al.

(10) Patent No.: US 9,154,029 B2
(45) Date of Patent: Oct. 6, 2015

(54) POWER SUPPLY MODULATION METHOD AND POWER SUPPLY MODULATOR

(75) Inventors: Linguo Wang, Shenzhen (CN); Bin Zhang, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 192 days.

(21) Appl. No.: 14/005,543

(22) PCT Filed: Oct. 24, 2011

(86) PCT No.: PCT/CN2011/081177
§ 371 (c)(1),
(2), (4) Date: Sep. 17, 2013

(87) PCT Pub. No.: WO2012/122800
PCT Pub. Date: Sep. 20, 2012

(65) Prior Publication Data
US 2014/0002053 A1    Jan. 2, 2014

(30) Foreign Application Priority Data

Mar. 17, 2011 (CN) .......................... 2011 1 0064511

(51) Int. Cl.
*G05F 1/00* (2006.01)
*H02M 3/10* (2006.01)
(Continued)

(52) U.S. Cl.
CPC ............... *H02M 3/10* (2013.01); *H02M 3/155* (2013.01); *H03F 1/0227* (2013.01); *H02M 2001/0022* (2013.01); *H02M 2001/0045* (2013.01); *H02M 2003/1566* (2013.01)

(58) Field of Classification Search
CPC ............ H02M 2001/0016; H02M 2001/0003; H02M 2001/0045; H02M 2001/0022; H02M 2003/1566
USPC ......... 323/234, 237, 265, 273–275, 282–284, 323/299, 300, 303; 363/65–72
See application file for complete search history.

(56) References Cited

U.S. PATENT DOCUMENTS

| 7,058,373 B2 * | 6/2006 | Grigore ..................... 455/127.1 |
| 7,545,131 B1 * | 6/2009 | Alexander ..................... 323/284 |

(Continued)

FOREIGN PATENT DOCUMENTS

| CN | 1674449 A | 9/2005 |
| CN | 1879070 A | 12/2006 |
| CN | 101588125 A | 11/2009 |

OTHER PUBLICATIONS

International Search Report in international application No. PCT/CN2011/081177, mailed on Feb. 2, 2012. (3 pages).

(Continued)

*Primary Examiner* — Jeffrey Gblende
(74) *Attorney, Agent, or Firm* — Oppedahl Patent Law Firm LLC

(57) ABSTRACT

A modulation method and modulator for an envelope tracking power supply. An output of a multi-level switching regulator (202) in the envelope tracking power supply modulator is in parallel connection with an output of a linear regulator (201) via an inductor (203) and supplies power to a load. The modulation method for the envelope tracking power supply includes: generating a first control signal (209) according to the current (211) obtained from inputting a first reference level signal (206); comparing the amplitude of a second reference level signal (2061) obtained according to the first reference level signal (206) with preset amplitudes of at least three levels, and outputting a second control signal (210) according to the comparison result and the first control signal (209); the multi-level switching regulator (202) outputting a level signal of corresponding amplitude according to the second control signal (210), and loading the amplitude of the level on the inductor (203) to output an inductive current (208'); and linearly regulating the first reference level signal (206) via a linear regulator (201) to obtain a voltage output (207) to the load. The present disclosure resolves the problem of fixed rate of change of current output by the switching regulator of the envelope tracking power supply regulator and cannot adjust to different load current change rates, thus the inductive current outputted by the multi-level switching regulator can better track the load current change.

18 Claims, 7 Drawing Sheets

(51) Int. Cl.
  *H02M 3/155*  (2006.01)
  *H03F 1/02*  (2006.01)
  *H02J 1/10*  (2006.01)
  *H02M 1/00*  (2007.01)
  *H02M 3/156*  (2006.01)

(56) References Cited

U.S. PATENT DOCUMENTS

| | | |
|---|---|---|
| 2005/0064830 A1 | 3/2005 | Grigore |
| 2005/0215209 A1 | 9/2005 | Tanabe et al. |
| 2006/0220590 A1 | 10/2006 | Tanabe et al. |
| 2006/0250825 A1 | 11/2006 | Grigore |
| 2008/0157895 A1 | 7/2008 | Immonen |
| 2009/0191826 A1* | 7/2009 | Takinami et al. ............. 455/110 |
| 2009/0218995 A1* | 9/2009 | Ahn ................. 323/235 |
| 2009/0289720 A1 | 11/2009 | Takinami et al. |
| 2011/0241775 A1* | 10/2011 | Kunihiro et al. ............. 330/127 |
| 2011/0273235 A1* | 11/2011 | Chen et al. .................... 330/295 |

OTHER PUBLICATIONS

English Translation of the Written Opinion of the International Search Authority in international application number: PCT/CN2011/081177, mailed on Feb. 2, 2012. (6 pages).

Supplementary European Search Report in European application No. 11861029.4, mailed on Feb. 17, 2015.

* cited by examiner

POWER SUPPLY MODULATION METHOD AND POWER SUPPLY MODULATOR

TECHNICAL FIELD

The present disclosure relates to communication technology, in particular to a power supply modulation method and a power supply modulator.

BACKGROUND

In a power supply that supplies power to a Radio Frequency (RF) power amplifier, it is commonplace to employ a voltage modulation in the power supply.

Hereinafter, the voltage modulation will be described by taking the RF power amplifier as a load. To deal with the increasing user requirements for bandwidth, the modulation mode for the communication system becomes more and more complicated. One prominent problem is that the efficiency of the RF power amplifier is low, which is the bottleneck for improving the efficiency of whole communication system. As to the linear power amplifier, if a conventional DC power supply is used, to preserve linearity, it is required that the supply voltage be greater than the peak voltage of RF signals. When the peak of RF signals is relatively low, the power amplifier simultaneously withstands higher voltage and load current, and thus the efficiency of the power amplifier is relatively low. The average efficiency of the power amplifier depends on the Peak to Average Power Ratio (PAPR) of the RF signals. To maximize communication bandwidth within a limited frequency band, modern communication systems employ a modulation mode with a non-constant envelope (amplitude) and higher PAPR. For example, the PAPR is 6.5 db~7.0 dB in the Wideband Code Division Multiple Access (WCDMA) system and the PAPR is 9.0 db~9.5 dB in Orthogonal Frequency-Division Multiple Access (OFDMA) used in the Long Term Evolution (LTE) and Worldwide Interoperability for Microwave Access (WiMax), which causes a reduction of the efficiency of the power amplifier. A series of other problems appear, such as increase of the power amplifier's size and weight, and higher requirements to thermal environments for the air cooling, which results in increased application and maintenance costs. Therefore, it is significant to improve the efficiency of the power amplifier.

According to the existing literature and technologies, the manner for improving the power amplifier depending on the power supply technology mainly comprises the Envelope Elimination and Restoration (EER) power supply and the Envelope Tracking (ET) power supply. According to the EER power supply technology, a RF signal to be amplified is separated to an envelope and a phase modulation signal utilizing the feature i.e., a constant envelope signal may be effectively amplified by a nonlinear power amplifier, then the nonlinear power amplifier is powered by the ET power supply to restore the amplified RF signals. Since the amplified signal amplitude depends on the output voltage amplitude of the ET power supply, it requires higher tracking precision of the ET power supply, otherwise the linearity of the amplified signal will be affected. The ET power supply technology employs the linear power amplifier, and improves the efficiency of the linear power amplifier through dynamically adjusting the supply voltage of the ET signals. In the above two solutions, dynamically modulating the output voltage of the power supply is required. The power supply modulator must simultaneously keep a high efficiency to ensure that the two solutions may effectively improve the efficiency of the whole amplifier system.

In a modern communication system, an RF envelope signal has a wider bandwidth. For example, the bandwidth of WCDMA with a single carrier is 5 MHz, and the bandwidth of WCDMA with four carriers is 20 MHz. The ET power supply is required to provide a high modulation bandwidth and high efficiency. In the prior art, a switched-mode power supply regulator is able to provide a high conversion efficiency. However, extremely high switching speed is required in the application for 20 MHz bandwidth, which cannot be achieved through the conventional switch devices, which causes the reduction of the conversion efficiency of the regulator. In the prior art, the switched-mode power supply regulator always cooperates with the linear power supply regulator to utilize the high frequency feature of the linear power supply regulator and the efficiency of the switch-mode power supply regulator, so as to optimize the precision of modulation and efficiency. A typical structure is shown in FIG. 1, in which a linear regulator 201 employs a feedback control of an output voltage 207, so as to ensure that the output voltage 207 of the linear regulator 201 tracks a reference input signal 206. A switch regulator 102 is a current source structure which is a composed of a step-down switch circuit, i.e., a BUCK circuit. The control manner of the switch regulator 102 is that the linear regulator 201 outputs current 208 to a hysteresis controller 103. That is, detecting the output current 208 of the linear regulator 201, when the output current 208 of the linear regular 201 is high, a switch tube 104 turns on and the output current of a switch regulator 102 is increased; when the output current 208 of the linear regular 201 is low, a switch tube 105 turns on and the output current of the switch regulator 102 is reduced; thereby, controlling the amplitude of the output current 208 of the linear regulator 201 be in a low range and reducing the output power the linear regulator 201. Since the efficiency of the linear regulator is relatively low, the reduction of the output power of the linear regulator 201 may help to improve the efficiency of the power supply modulator system.

However, in the prior art above mentioned, there are the following issues: the current change rate of the switch regulator 102 with the BUCK circuit is fixed, which cannot adapt to various load current change rates. Taking the RF power amplifier as an example, the current change rate of the RF envelope signals is relatively high, and the load current of the power supply regulator also changes therewith. The fixed output current change rate of the switched regulator may cause the tracking sometimes to fail under the current change rate of a higher load current; and may cause frequent switching under the current change rate of a lower load current, so that the switching frequency and the switching loss are increased and the system efficiency is reduced.

SUMMARY

To address the issue in the prior art that the current change rate of the switch regulator with the BUCK circuit is fixed and cannot adapt to current change rates for various load current, the disclosure provides a power supply modulation method and a power supply modulator.

An embodiment of the disclosure provides a modulation method for an envelope tracking power supply. An output of a multi-level switch regulator in the envelope tracking power supply is connected in parallel with an output of a linear regulator through an inductor. The method includes the following steps:

generating a first control signal according to a current obtained from an input first reference level signal; the first reference level signal controlling a change trend of an output current of the multi-level switch regulator;

comparing an amplitude of a second reference level signal obtained from the first reference level signal with preset amplitudes of at least three grades of levels, outputting a second control signal according to a result of the comparison and the first control signal; at least one of the preset amplitudes of at least three grades of levels is less than the amplitude of the second reference level signal, and at least one of the preset amplitudes of at least three grades of levels is greater than the amplitude of the second reference level signal;

outputting, by the multi-level switch regulator, a level signal with corresponding amplitude according to the second control signal, and applying a level with the corresponding amplitude on the inductor to output an inductive current; and linearly adjusting, by a linear regulator, the first reference level signal to obtain a voltage output from the power supply to a load.

Another embodiment of the disclosure provides a modulator for an envelope tracking power supply. The modulator includes a linear regulator, a multi-level switch regulator, an inductor, a current controller and a level selection controller.

An output of the multi-level switch regulator is connected in parallel with an output of the linear regulator through the inductor;

the current controller, the level selection controller and the multi-level switch regulator are connected in series in turn;

the current controller is configured to generate a first control signal according to a current obtained from an input first reference level signal; the first reference level signal controls a change trend of an output current of the multi-level switch regulator, the current controller is connected with the level selection controller through a port for outputting the first control signal, and a second reference level signal obtained from the first reference level signal is input to the level selection controller;

the level selection controller is configured to compare an amplitude of the second reference level signal obtained from the first reference level signal with preset amplitudes of at least three grades of levels to output a second control signal; at least one of the preset amplitudes of at least three grades of levels is less than the amplitude of the second reference level signal, and at least one of the preset amplitudes of at least three grades of levels is greater than the amplitude of the second reference level signal, the level selection controller is configured to be connected with the multi-level switch regulator through a port for outputting the second control signal;

the multi-level switch regulator is configured to output a level signal with a corresponding amplitude according to the second control signal, and to apply a level with the corresponding amplitude on the inductor to output an inductive current; and the linear regulator is configured to linearly adjust the first reference level signal to obtain a voltage output from the power supply to a load.

According the solutions of the disclosure, the multi-level switch regulator cooperates with the linear regulator and the multi-level switch regulator outputs voltages with at least three different amplitudes, so that the inductive current may better track the change of the load current, so as to address the issue in the prior art that the inductive current cannot efficiently track the load current change rate.

DETAILED DESCRIPTION

Hereinafter, the technical solution of the disclosure will be detailed in conjunction with the drawings.

Figure 1:
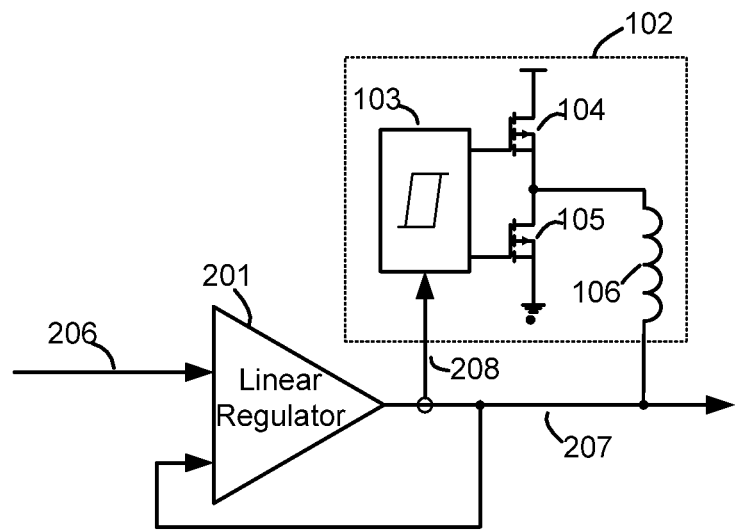
FIG. 1 is a structure diagram of a power supply modulator in the prior art.
Figure 2:
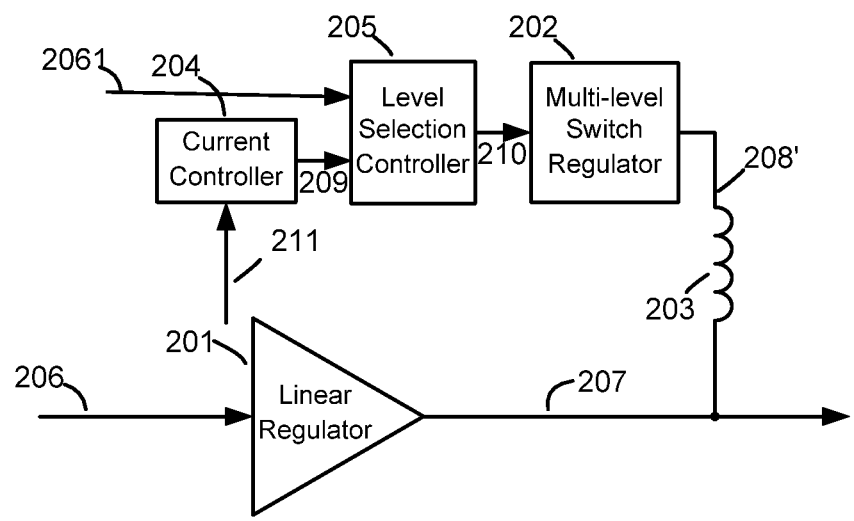
FIG. 2 is a diagram of a potential control principle for a current controller according to the disclosure.

To address the issue in the prior art, i.e., the current change rate of the switch regulator 102 with the BUCK circuit shown in FIG. 1 is fixed and cannot adapt to current change rates for various load current values. The disclosure provides a power supply modulator shown in FIG. 2 comprising a linear regulator 201, a multi-level switch regulator 202, an inductor 203, a current controller 204 and a level selection controller 205. An output of the multi-level switch regulator 202 is connected in parallel with the linear regulator 210 through the inductor 203. The current controller 204, the level selection controller 205, the multi-level switch regulator 202 and the inductor 203 are connected in series in turn. The current controller 204 generates a first control signal 209 according to a current 211 obtained according to an input first reference level signal 206. The current controller 204 is connected with the level selection controller 205 through a port for outputting the first control signal 209. A second reference level signal 2061 is input to the level selection controller 205. The level selection controller 205 compares the amplitude of the second reference level signal 2061 obtained according to the first reference level signal 206 with preset amplitudes of at least three grades of levels, and outputs a second control signal 210 according to a result of the comparison and the first control signal 209. The level selection controller 205 is connected with the multi-level switch regulator 202 through a port for outputting the second control signal 210. The multi-level switch regulator 202 outputs a level signal with a corresponding amplitude according to the second control signal 210, and applies a level with the corresponding amplitude on the inductor 203 to output an inductive current 208'. The linear regulator 201 linearly adjusts the first reference level signal 206 to obtain a linearly adjusted output voltage 207, i.e., a voltage output from the power supply to a load. The linear regulator 201 is connected in parallel with the multi-level switch regulator 202 through the inductor 203. The linear regulator 201 adopts the voltage control and adjusts the voltage output to the load according to an envelope signal served as the first reference level signal 206. When the change rate of the envelope signal has large fluctuation, the load current of the power supply modulator changes accordingly, the inductive current 208' may better track the change of the load current. The output current of the linear regulator 201 may be better controlled through the multi-level switch regulator 202, and may be limited to a smaller hysteresis loop, so as to limit power provided by the linear regulator 201 and reduce loss thereof to improve the efficiency of the whole power supply system.

Figure 3:
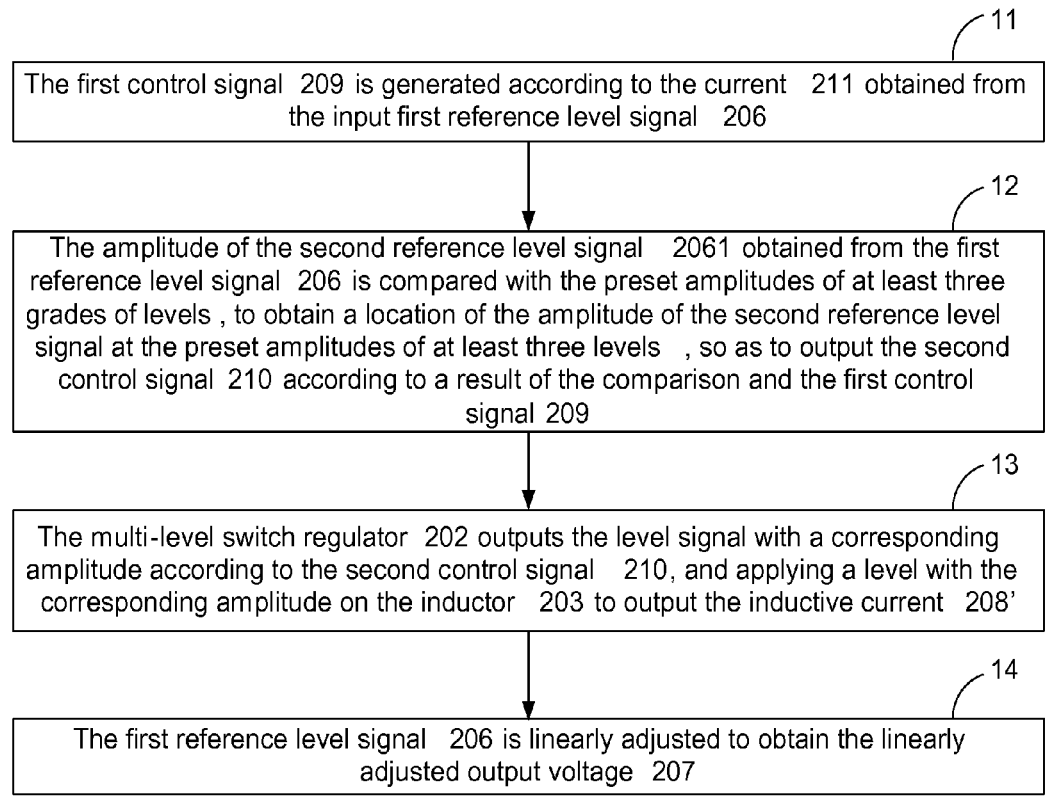
FIG. 3 is a structure diagram of a power supply modulator according to the disclosure.

The disclosure provides a modulation method for the power supply based on the above power supply modulator, which is shown in FIG. 3. The modulation method comprises the following steps:

Step 11: The first control signal 209 is generated according to the current 211 obtained from the input first reference level signal 206. The first control signal 209 controls the change of the inductive current output from the multi-level switch regulator 202.

Step 12: The amplitude of the second reference level signal 2061 obtained from the first reference level signal 206 is compared with the preset amplitudes of at least three grades of levels, and the second control signal 210 is output according to a result of the comparison and the first control signal 209.

Step 13: The multi-level switch regulator 202 outputs the level signal with a corresponding amplitude according to the second control signal 210, and applies a level with the corresponding amplitude on the inductor 203 to output the inductive current 208'.

Step 14: The first reference level signal 206 is linearly adjusted to obtain the linearly adjusted output voltage 207.

Figure 4:
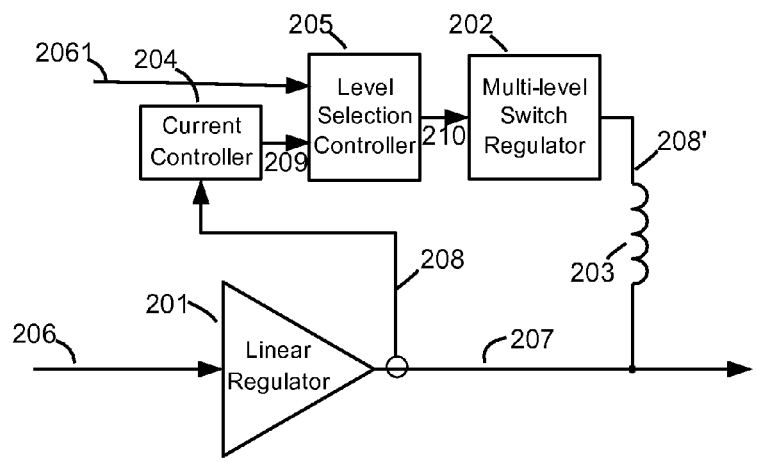
FIG. 4 is a structure diagram of a detailed power supply modulator according to the disclosure.

As shown in FIG. 4, in Step 11, the linearly adjusted output current 208 is served as the current 211 obtained from the first reference level signal 206, which may be realized through the power supply modulator shown in FIG. 4, which differs from the power supply modulator shown in FIG. 3 in that the current 208 (served as the current 211 obtained from the first reference level signal) output from the linear regulator 201 is sampled and input to the current controller 204.

Figure 5:
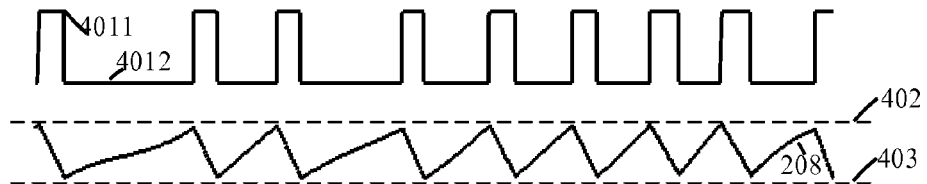
FIG. 5 is a waveform diagram obtained by a potential control method for the current controller according to the disclosure.

Taking the linearly adjusted output current 208 served as the current 211 obtained from the first reference level signal 206, as an example, the waveform during the generation of the first control signal 209 is shown in FIG. 5. When the linearly adjusted output current 208 is greater than the preset upper limit threshold 402, the generated first control signal 209 is a signal 4011 that controls the multi-level switch regulator 202 to increase the output inductive current; when the linearly adjusted output current 208 is less than the preset lower limit threshold 403, the generated first control signal 209 is a signal 4012 that controls the multi-level switch regulator 202 to reduce the output inductive current.

Figure 6:
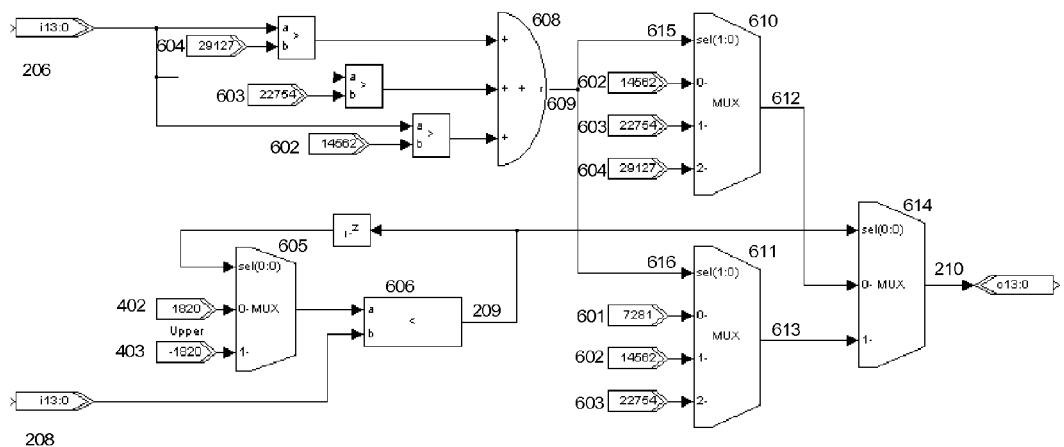
FIG. 6 is a detailed circuit structure diagram for a level selection controller according to the disclosure.

An embodiment of the circuit of the current controller 204 and the level selection controller 205 is shown in FIG. 6. The inductive current control signal 209 is output after the current 208 output from the linear regulator passes the hysteresis comparison composed of a comparator 606 and a first multiplexer 605, wherein, the input signals of the first multiplexer 605 are the preset upper limit threshold 402 and the preset lower limit threshold 403. A location signal 609 is obtained by a accumulator 608 after the comparison between the first reference level signal 206 and each grade level 602, 603 and 604. The location signal 609 is respectively input to a control end 615 of a second multiplexer 610 and a control end 616 of a third multiplexer 611; the second multiplexer 610 and the third multiplexer 611 respectively output upper grade level 612 and next grade level 613 of the current location. Input signals 601, 602, 603 and 604 of the second multiplexer 610 and the third multiplexer 611 respectively are respective levels from low to high of the multi-level switch regulator 202. At last, a fourth multiplexer 614 outputs a second control signal 210 according to the current control signal 209.

The linearly adjusted output current estimation obtained according to the first reference level signal 206 and circuit parameters may also serve as the current 211 obtained from the first reference signal 206; the difference is that the former is real current and the latter is a current estimation obtained from a predictive algorithm.

Figure 7:
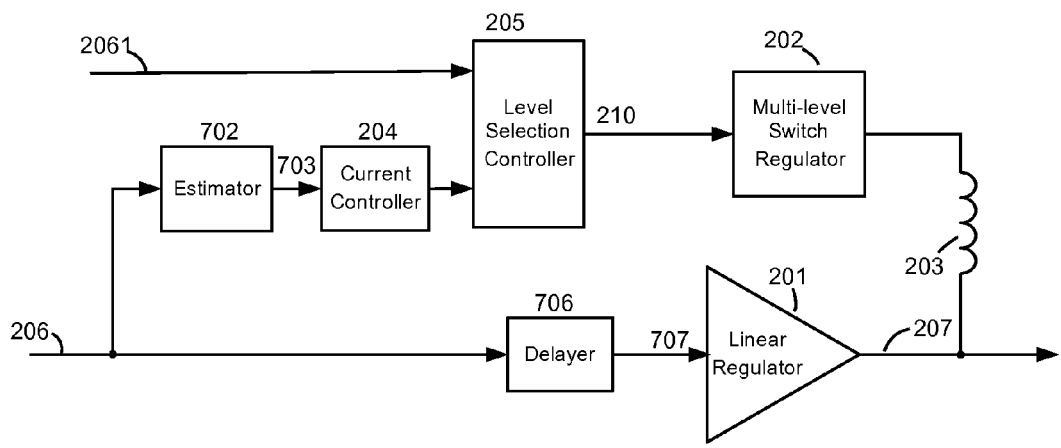
FIG. 7 is another detailed structure diagram of the power supply modulator according to the disclosure.

It may be realized using the power supply modulator shown in FIG. 7 that the linearly adjusted output current estimation obtained serves as the current 211 obtained from the first reference signal 206. The power supply modulator shown in FIG. 7 differs from that shown in FIG. 3 in that the first reference level signal 206 is input to an estimator 702; the estimator 702 obtains a linearly adjusted output current estimation 703 (serving as the current 211 obtained from the first reference signal) according to the first reference level signal 206 and the circuit parameters. A port of the estimator 702 for outputting current estimation is connected to the input of the current controller 204 for the current 211 obtained from the first reference level signal, and then obtains the second control signal 210 through the above methods for controlling current and controlling level selection. Since the second control signal 210 is not obtained from the output of the linear regulator 201, the first reference level signal 206 of the linear regulator 201 may be input to a delayer to match a delay of the multi-level switch regulator 202 so as to output delayed first reference level signal 707. The above circuits may be realized, but not limited to, by the digital control manner such as FPGA, CPLD and DSP.

Figure 8:
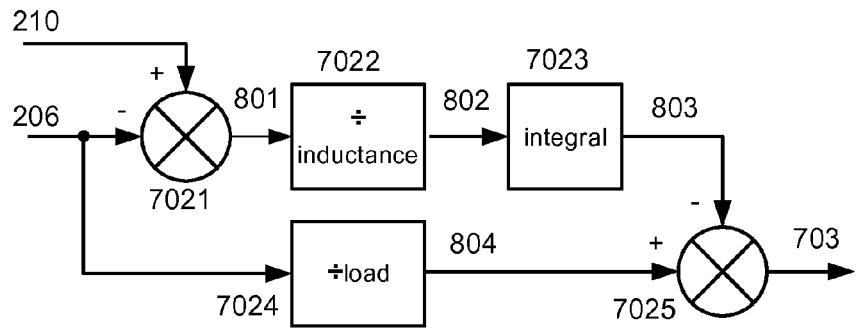
FIG. 8 is a diagram of a potential principle for realizing a controller according to an embodiment shown in FIG. 7.

FIG. 8 shows a specific circuit for realizing the power supply modulator shown in FIG. 7. The specific circuit estimates real output amplitude of the multi-level switch regulator 202 using the second control signal 210 and estimates a real output voltage of the linear regulator 201 using the first reference level signal 206. The second control signal 210 and the first reference level signal 206 are input to a first subtracter 7021 of the estimator 702; the first subtracter 7021 of the estimator 702 outputs a differential signal 801 that is a voltage estimation of two ends of the inductor and is input to a divider 7022 of the estimator 702 to divide an inductance, so as to obtain an inductive current change rate 802; the inductive current change rate 802 is input to an integrator 7023 of the estimator 702 to perform a time integration so as to obtain an estimated inductive current 803. A load current estimation 804 may be obtained by a second divider 7024 of the estimator 702 through dividing the load value by the first reference level signal 206. The load current estimation 804 and the estimated inductive current 803 are input to a second subtracter 7025 of the estimator 702, and a difference output from the second subtracter is the linearly adjusted output current estimation 703.

Figure 9:
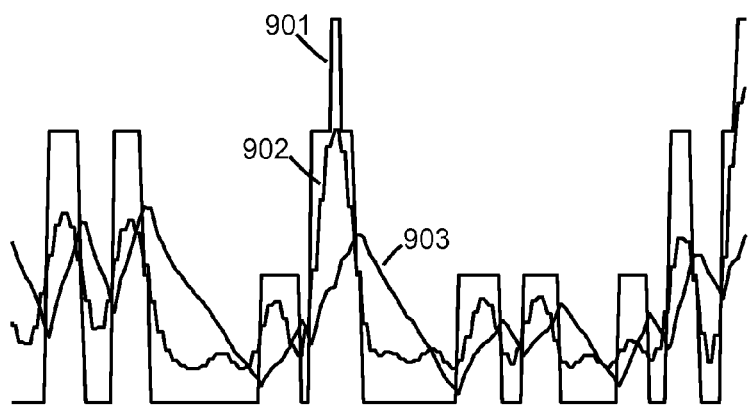
FIG. 9 is a waveform diagram according to the embodiment shown in FIG. 7.

A potential waveform is shown in FIG. 9 through using the power supply modulator with the estimator 702 shown in FIG. 8. A waveform 901 is a waveform diagram of the second control signal 210, a waveform 902 is a waveform diagram of the first reference level signal 206, and a waveform 903 is a waveform diagram of a product of the inductive current 208' output from the multi-level switch regulator 202 and the load.

Figure 10:
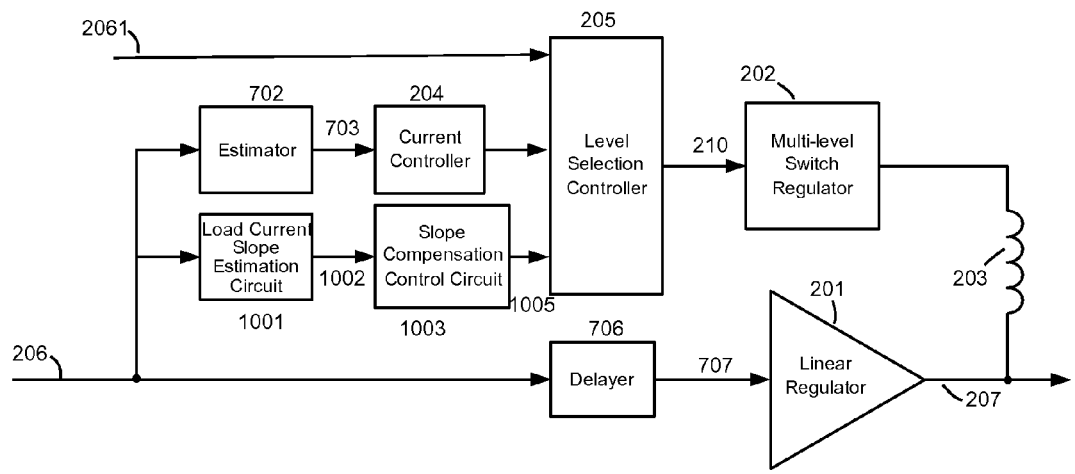
FIG. 10 is another structure diagram of the power supply modulator according to the disclosure.

In FIG. 9, a phenomenon that the inductive current estimation (i.e., the estimation of the inductive current 208' output from the multi-level switch regulator 202) cannot track the load current may still exist. FIG. 10 shows an embodiment with added load current slope compensation based on the embodiment shown in FIG. 7, so as to further improve the tracking effect of the load current by the inductive current. A load current slope estimation circuit 1001 and a slope compensation control circuit 1003 are applied to the embodiment shown in FIG. 10. The first reference level signal 206 is input to the load current slope estimation circuit 1001; the load current slope estimation circuit 1001 estimates the load current slope according to the first reference level signal 206 and circuit parameters of the power supply, to obtain a predicted signal of the load current change rate; a port for outputting the predicted signal 1002 of the load current change rate is connected with the slope compensation control circuit 1003; the slope compensation control circuit 1003 performs slope compensation control on the predicted signal 1002 of the load current change rate to obtain a slope compensation control signal 1005; a port for outputting the slope compensation control signal 1005 is connected with the level selection controller 205; the level selection controller 205 further performs adjustments according to the slope compensation control signal 1005 through the second control signal 210 obtained according to the previously obtained location signal 609 (i.e., the result of comparison) of the first reference level signal 206 and the first control signal 209, so that the inductive current may better track the load current.

Figure 11:
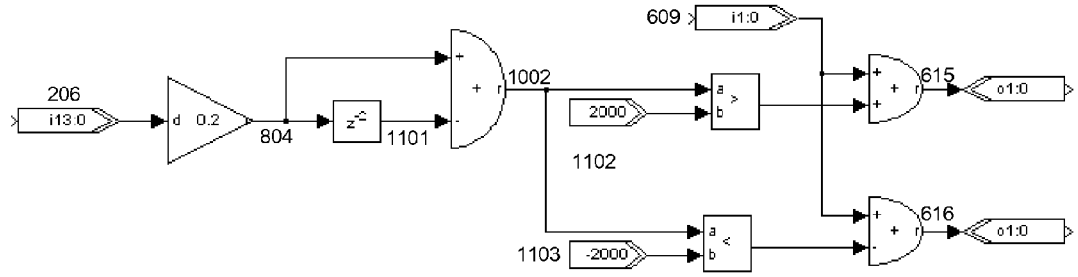
FIG. 11 is a diagram of a potential control principle according to an embodiment shown in FIG. 10.

FIG. 11 shows a potential logical circuit for realizing the solution of the load current slope estimation shown in FIG. 10. As shown in FIG. 11, the first reference level signal 206 is input to the divider of the load current slope estimation circuit 1001 to divide the load value, so as to obtain a load predicted current 804; the load predicted current 804 subtracts the delay signal 1101 thereof to obtain the predicted signal 1002 of the load current change rate; the predicted signal 1002 of the load current change rate and the preset upper limit threshold 1102 are input to the first comparator of the slope compensation control circuit 1003. When the forward direction change rate is greater than the upper limit threshold 1102, the slope compensation control signal 1005 is output, and the first summator of the slope compensation control circuit 1003 compensates the current location 609 by adding 1 according to the slope compensation control signal 1005 output at this moment, and outputs the compensated signal to the port 615 of the level selection controller shown in FIG. 6; the multi-level switch regulator 202 forwardly outputs one grade higher level amplitude to accelerate the increase of the output inductive current. Similarly, when the backward direction change rate is over the lower limit threshold 1103, the slope compensation control signal 1005 is output, and the second summator of the slope compensation control circuit 1003 compensates the current location 609 by subtracting 1 according to the slope compensation control signal 1005 output at this moment, and outputs the compensated signal to the port 616 of the level selection controller shown in FIG. 6; the multi-level switch regulator 202 backwardly outputs one grade lower level amplitude to accelerate the reduction of the output inductive current.

Figure 12:
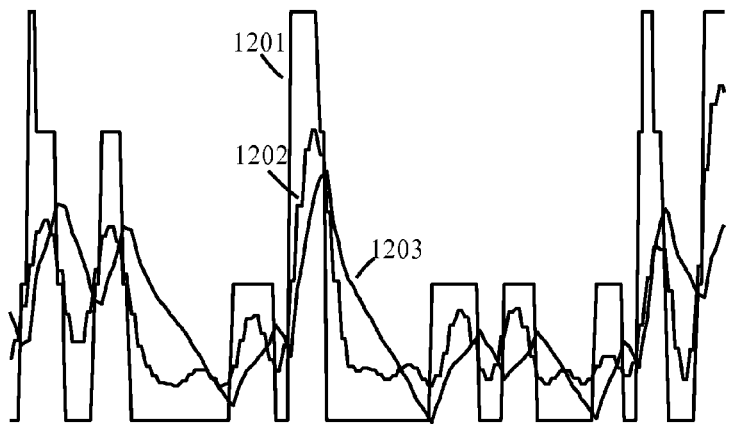
FIG. 12 is a waveform diagram according to the embodiment shown in FIG. 10.

FIG. 12 shows a potential waveform diagram obtained from the solution of the load current slope compensation as shown in FIG. 10. A waveform 1201 is a waveform diagram of the second control signal 210 after adding the load current slope compensation, a waveform 1202 is a waveform diagram of the first reference level signal 206, and a waveform 1203 is a waveform diagram of a product of the predicted inductive current and the load. It can be seen from FIG. 12 that the effect of tracking the load current by the inductive current is obviously improved.

Figure 13:
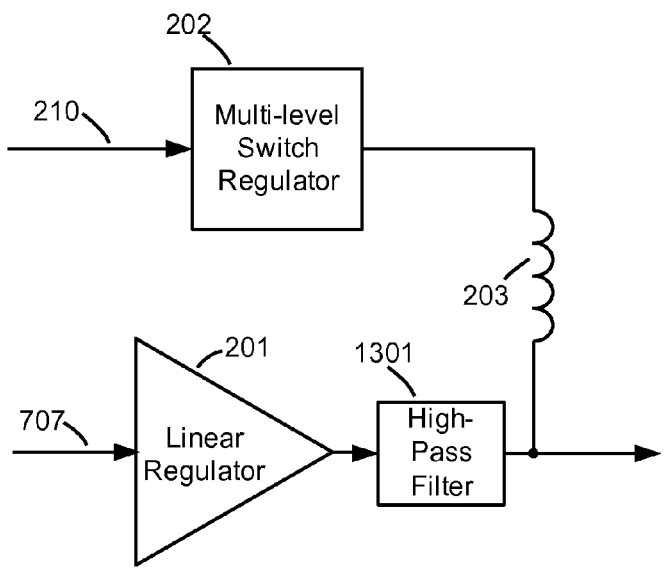
FIG. 13 is an additional structure diagram of the power supply modulator according to the disclosure.

In the embodiments shown in FIGS. 7 and 10, the control of the multi-level switch regulator 202 does not employ the feedback signal output from the linear regulator 201, therefore, the output level obtained from the predictive algorithm may cause a problem about the volt-second balance of the inductor. For a low-frequency signal, it presents for the inductor that a low resistance is connected with two voltage sources, which are the multi-level switch regulator and linear regulator. FIG. 13 shows an additional embodiment for addressing the above issue. As shown in FIG. 13, the output of the linear regulator 201 is connected to a high-pass filter 1301, so that the linearly adjusted output voltage is filtered by the high-pass filter and then the linear regulator 201 is connected in parallel with the multi-level switch regulator 202 through the inductor 203, and thus the output voltage, which is obtained through linear adjustment performed on the first reference level signal 206 by the linear regulator 201, is filtered by the high-pass filter, and the filtered voltage serves as a voltage of the load output from the power supply, which increases impedance of the low-frequency signal between the two voltage sources, i.e., the multi-level switch regulator 202 and linear regulator 201, and addresses the problem about the volt-second balance of the inductive current through automatically adjusting the output voltage.

Figure 14:
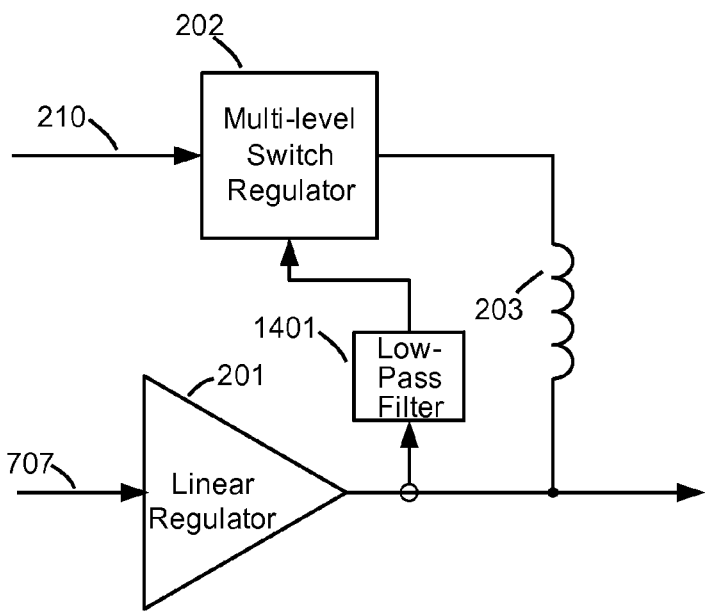
FIG. 14 is another additional structure diagram of the power supply modulator according to the disclosure.

FIG. 14 shows another embodiment for addressing the problem about the volt-second balance according to the disclosure. As shown in FIG. 14, the output of the linear regulator 201 is sampled to be connected to a low-pass filter 1401, so as to perform low-pass filtering on the linearly adjusted output sampled current signal to output low-frequency signal of the sampled current signal; a port of the low-pass filter 1401 for outputting low-frequency signal of the current is connected with the multi-level switch regulator 202. The output DC component of the multi-level switch regulator 202 is controlled using filtered sampled current signal, so as to keep the inductive current in balance.

In Step 12, respective level amplitudes to be compared are set according to respective level signal amplitudes output from the multi-level switch regulator 202 and match with the amplitude of the second reference level signal 2061.

Figure 15:
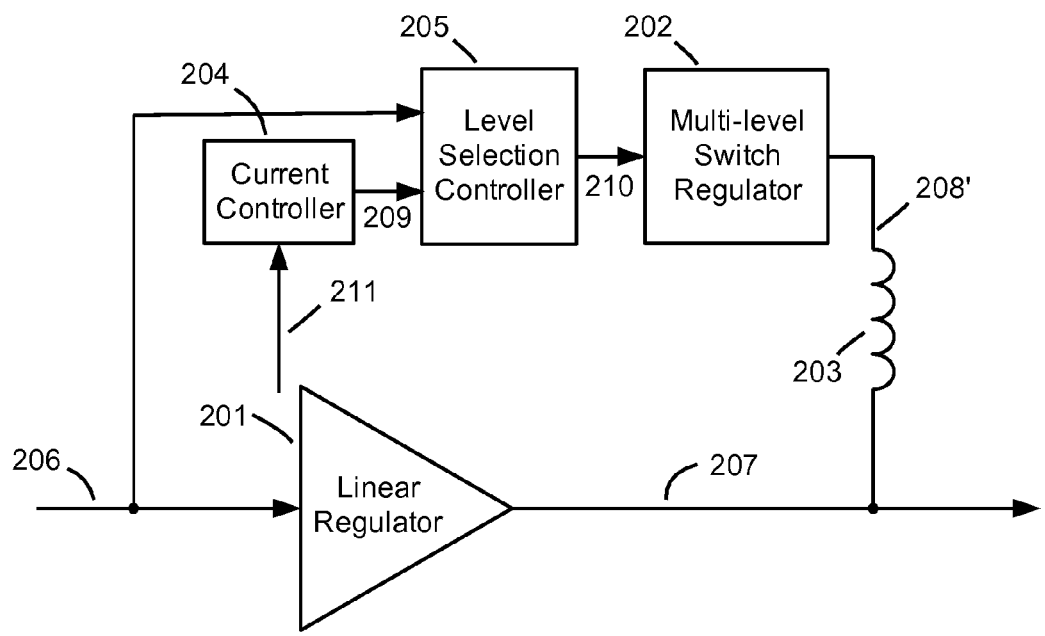
FIGS. 15 and 16 are two structure diagrams of the power supply modulator according to the disclosure.
Figure 16:
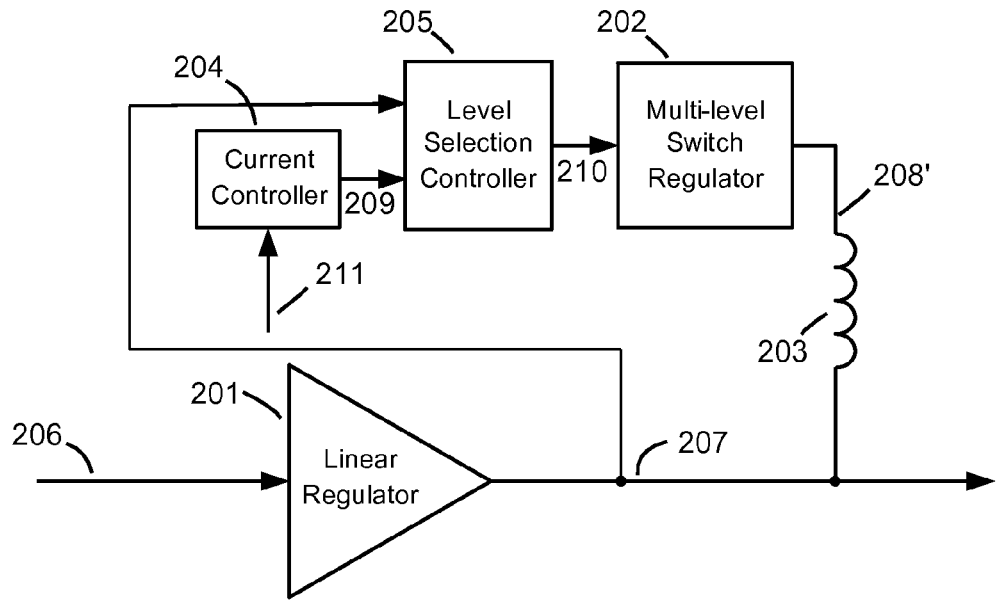

Given that preset amplitudes of three grades of levels respectively are 1V, 2V and 3V, the amplitude of the second reference level signal 2061 is 2.3V, which is compared with 1V, 2V and 3V. Since 2.3V is between 2V and 3V, it is determined that one grade upper level and one grade lower level of the second reference level signal 2061 respectively are the level with 2V and the level with 3V. The second reference level signal 2061 may be the first reference level signal 206, and also may be the linearly adjusted output level signal 207 obtained by linearly adjusting the first reference level signal 206. When realized by the hardware, the input of the level selection controller 205 for inputting the second reference level signal may input the first reference level signal 206, as shown in FIG. 15; or, the input of the level selection controller 205 for inputting the second reference level signal may input the signal obtained by linearly adjusting the first reference level signal 206, as shown in FIG. 16.

Since respective amplitudes of the first reference level signal 206 and the output level signal 207 of the linear regulator are different, for example the amplitude of the first reference level signal 206 is 2.3V and the amplitude of the output level signal 207 of the linear regulator is 3.3V, if the output level signal 207 of the linear regulator serves as the second reference level signal 2061, the preset amplitudes of respective grades of levels need to match with the amplitude of the output level signal 207 of the linear regulator, for example, the amplitudes of respective grades of levels are set as 2V, 3V and 4V, the preset amplitudes of 2V, 3V and 4V are equal to the amplitudes of respective grades of levels output from the multi-level switch regulator 202. The 2V, 3V and 4V matching with the first reference level signal 206 and the 1V, 2V and 3V matching with the output level signal 207 of the linear regulator are set according to the amplitudes of respective grades of levels of 2V, 3V and 4V output from the multi-level switch regulator 202.

In the concrete implementation, when the first control signal 209 requires that the inductive current output from the multi-level switch regulator 202 becomes larger, the second control signal 210 may be a control signal instructing the multi-level switch regulator 202 to output a level with an amplitude one grade higher than that of the reference level signal; when the first control signal 209 requires that the inductive current output from the multi-level switch regulator 202 becomes smaller, the second control signal 210 may be a control signal instructing the multi-level switch regulator 202 to output a level with an amplitude one grade lower than that of the reference level signal. For example, the first control signal 209 requires that the inductive current output from the multi-level switch regulator 202 becomes larger, the second control signal 210 is a control signal instructing the multi-level switch regulator 202 to output a 3V level (the amplitude thereof is one grade higher than that of the reference level signal with 2.3V), vice versa. Regardless of corresponding to the first reference level signal 206 or the level signal 207 output from the linear regulator, the principle for setting amplitudes of respective grades of levels is that: at least one of the amplitudes of respective grades of levels to be compared is less than the first reference level signal 206 (or the level signal 207 output from the linear regulator), and at least one of the amplitudes of respective grades of levels to be compared is greater than the first reference level signal 206 (or the level signal 207 output from the linear regulator). Certainly, when the first control signal 209 requires that the inductive current output from the multi-level switch regulator 202 becomes larger, the second control signal 210 may be a control signal instructing the multi-level switch regulator 202 to output a level with an amplitude two grades higher than that of the reference level signal. The general principle is that the first control signal 209 requires that the inductive current output from the multi-level switch regulator 202 becomes larger or smaller, and the second control signal 210, obtained according to the comparison between the amplitude of the second reference level signal 2061 and preset the amplitudes of respective grades of levels, is a control signal instructing the multi-level switch regulator 202 to output a level with an amplitude higher (corresponding to increase of the inductive current) or lower (corresponding to reduction of the inductive current) than that of the reference level signal.

If the current estimation is adopted, the solution estimates the load current slope according to the first level signal 206 and circuit parameters of the power supply to obtain the predicted signal 1002 of the load current change rate, then performs slope compensation control on the predicted signal 1002 of the load current change rate to obtain the slope compensation control signal 1005, so as to output the second control signal according to the result of comparison, the first control signal and the slope compensation control signal. For example, the result of comparison is that the amplitude of the second reference level signal 2061 is 2.3V and between 2V and 3V, the first control signal 209 requires that the inductive current output from the multi-level switch regulator 202 becomes larger, and the location of the amplitude of the second reference level signal 2061 at amplitudes of respective grades of levels is added 1 according to the slope compensation control signal, i.e., the location between 2V and 3V is changed to between 3V and 5V (a location with one grade higher than the location between 2V and 3V), the second control signal is a control signal instructing the multi-level switch regulator to output a level with an amplitude two grades higher than that of the reference level signal.

Figure 17:
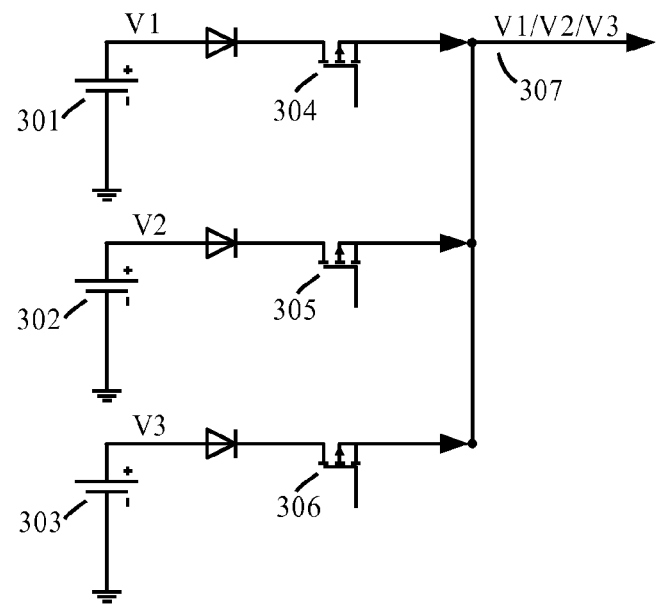
FIG. 17 is a potential structure diagram of a multi-level switch regulator according to the disclosure.

Specifically, the multi-level switch regulator 202 may have a switch structure as shown in FIG. 17. Voltages at various times of the second control signal 210 serve as the second control signal 210. For example, it is realized that the output amplitude of the multi-level switch regulator is the output voltage 307 of V1/V2/V3 through controlling conduction choice of switch tubes 304/305/306 by the input voltage 301/302/303, and V1/V2/V3 respectively are amplitudes of the input voltage 301/302/303.

Obviously, it should be understood that various modifications and changes may be made to the disclosure without departing from the spirit and scope of the disclosure. When these modifications and changes are within the scope of the appended claims and their equivalent technology, these modifications and changes are also included within the scope of protection of the disclosure.

INDUSTRIAL APPLICABILITY

The disclosure provides a power supply modulation method and a power supply modulator. The output of the multi-level switch regulator in the envelope tracking power supply is connected with the output of the linear regulator through the inductor, the first control signal is generated according to the current obtained from the input first reference level signal, which controls the variation trend of the current output from the multi-level switch regulator. The amplitude of the second reference level signal obtained according to the first reference level signal is compare with at least three grades of level amplitudes, so as to output the second control signal according to the result of comparison and the first control signal. At least one of the amplitudes of respective grades of levels to be compared is less than the amplitude of the second reference level signal, and at least one of amplitudes of respective grades of levels to be compared is greater than the amplitude of the second reference level signal. The multi-level switch regulator outputs a level signal with a corresponding amplitude according to the second control signal, and applies a level with the amplitude on the inductor to output the inductive current. The first reference signal is linearly adjusted by the linear regulator to obtain the voltage output from the power supply to the load. The multi-level switch regulator cooperates with the linear regulator and the multi-level switch regulator outputs voltages with at least three different amplitudes, so that the inductive current may better track the change of the load current, so as to address the issue in the prior art that the inductive current cannot efficiently track the load current change rate.

The invention claimed is:

1. A modulation method for an envelope tracking power supply, wherein an output of a multi-level switch regulator in the envelope tracking power supply is connected in parallel with an output of a linear regulator through an inductor, the method comprising: generating a first control signal according to a current obtained from an input first reference level signal, wherein the first reference level signal controls a change trend of an output current of the multi-level switch regulator; comparing an amplitude of a second reference level signal obtained from the first reference level signal with preset amplitudes of at least three grades of levels, outputting a second control signal according to a result of the comparison and the first control signal, wherein at least one of the preset amplitudes of at least three grades of levels is less than the amplitude of the second reference level signal and at least one of the preset amplitudes of at least three grades of levels is greater than the amplitude of the second reference level signal; outputting, by the multi-level switch regulator, a level signal with a corresponding amplitude according to the second control signal, and applying the level signal with the corresponding amplitude on the inductor to output an inductive current; and linearly adjusting, by the linear regulator, the first reference level signal to obtain a voltage output from the envelope tracking power supply to a load.

2. The method according to claim 1, wherein outputting the second control signal according to the result of the comparison and the first control signal comprises: outputting the second control signal that instructs the multi-level switch regulator to output a level signal with an amplitude higher than that of a reference level signal, when the first control signal requires that the inductive current output from the multi-level switch regulator becomes larger; and outputting the second control signal that instructs the multi-level switch regulator to output a level signal with an amplitude lower than that of the reference level signal, when the first control signal requires that the inductive current output from the multi-level switch regulator becomes smaller.

3. The method according to claim 1, wherein comparing the amplitude of the second reference level signal obtained from the first reference level signal with preset amplitudes of at least three grades of levels comprises: taking an amplitude of the first reference level signal as the amplitude of the second reference level signal, and comparing the amplitude of the first reference level signal with the preset amplitudes of at least three grades of levels.

4. The method according to claim 1, wherein comparing the amplitude of the second reference level signal obtained from the first reference level signal with preset amplitudes of at least three grades of levels comprises: taking an amplitude of a signal obtained through linearly adjusting the first reference signal as the amplitude of the second reference level signal, and comparing the amplitude of the signal obtained through linearly adjusting the first reference signal with the preset amplitudes of at least three grades of levels, wherein the preset amplitudes of respective grades of levels are equal to amplitudes of respective grades of levels output from the multi-level switch regulator.

5. The method according to claim 1, wherein generating the first control signal according to the current obtained from the input first reference level signal comprises: generating the first control signal that controls the multi-level switch regulator to increase the inductive current output from the multi-level switch regulator, when the current obtained from the input first reference level signal is greater than an upper limit threshold; and generating the first control signal that controls the multi-level switch regulator to reduce the inductive current output from the multi-level switch regulator, when the current obtained from the input first reference level signal is less than a lower limit threshold.

6. The method according to claim 5, wherein, the current obtained from the input first reference level signal is a linearly adjusted output current, or a linearly adjusted output current estimation obtained according to the first reference level signal and circuit parameters of the power supply.

7. The method according to claim 6, further comprising, after obtaining the linearly adjusted output current estimation according to the first reference level signal and circuit parameters of the power supply, of: estimating a load current slope according to the first reference level signal and circuit parameters of the power supply to obtain a predicted signal of a load current change rate, and performing slope compensation control on the predicted signal of the load current change rate to obtain a slope compensation control signal; wherein outputting the second control signal according to the result of the comparison and the first control signal comprises: outputting the second control signal according to the result of the comparison, the first control signal and the slope compensation control signal.

8. The method according to claim 6, wherein linearly adjusting, by the linear regulator, the first reference level signal to obtain the voltage output from the power supply to the load comprises: performing high-pass filtering on an output voltage after linearly adjusting the first reference level signal by the linear regulator; and using the filtered output voltage as the voltage output from the power supply to the load.

9. The method according to claim 6, wherein outputting, by the multi-level switch regulator, the level signal with the corresponding amplitude and applying a level signal with the corresponding amplitude on the inductor to output the inductive current comprises: performing low-pass filtering on a sampled current signal output after linearly adjusting; and using the filtered sampled current signal to control the inductive current output from the multi-level switch regulator.

10. A modulator for an envelope tracking power supply, comprising a linear regulator, a multi-level switch regulator, an inductor, a current controller and a level selection controller, wherein, an output of the multi-level switch regulator is connected in parallel with an output of the linear regulator through the inductor; the current controller, the level selection controller and the multi-level switch regulator are connected in series; the current controller is configured to generate a first control signal according to a current obtained from an input first reference level signal, wherein the first reference level signal controls a change trend of an output current of the multi-level switch regulator, the current controller is connected with the level selection controller through a port for outputting the first control signal, and a second reference level signal obtained from the first reference level signal is input to the level selection controller; the level selection controller is configured to compare an amplitude of the second reference level signal obtained from the first reference level signal with preset amplitudes of at least three grades of levels to output a second control signal, wherein at least one of the preset amplitudes of at least three grades of levels is less than the amplitude of the second reference level signal, and at least one of the preset amplitudes of at least three grades of levels is greater than the amplitude of the second reference level signal, the level selection controller is connected with the multi-level switch regulator through a port for outputting the second control signal; the multi-level switch regulator is configured to output a level signal with a corresponding amplitude according to the second control signal, and to apply a level signal with the corresponding amplitude on the inductor to output an inductive current; and the linear regulator is configured to linearly adjust the first reference level signal to obtain a voltage output from the envelope tracking power supply to a load.

11. The modulator according to claim 10, wherein the level selection controller is further configured to: output the second control signal that instructs the multi-level switch regulator to output a level signal with an amplitude higher than that of a reference level signal, when the first control signal requires that the inductive current output from the multi-level switch regulator becomes larger; and output the second control signal that instruct the multi-level switch regulator to output a level signal with an amplitude lower than that of the reference level signal, when the first control signal requires that the inductive current output from the multi-level switch regulator becomes smaller.

12. The modulator according to claim 10, wherein the first reference level signal is input to an input for the second reference signal of the level selection controller, and wherein the level selection controller is further configured to compare an amplitude of the first reference level signal with preset amplitudes of at least three grades of levels.

13. The modulator according to claim 10, wherein, an input for the second reference signal of the level selection controller is configured to input a signal obtained through linearly adjusting the first reference signal, the level selection controller is further configured to compare an amplitude of the signal obtained through linearly adjusting the first reference signal with preset amplitudes of at least three grades of levels, wherein, the preset amplitudes of respective grades of levels are equal to amplitudes of respective grades of levels output from the multi-level switch regulator.

14. The modulator according to claim 10, wherein, the current controller is further configured to: generate the first control signal that controls the multi-level switch regulator to increase the output inductive current, when the current obtained from the input first reference level signal is greater than an upper limit threshold; and generate the first control signal that controls the multi-level switch regulator to reduce the output inductive current, when the current obtained from the input first reference level signal is less than a lower limit threshold.

15. The modulator according to claim 14, wherein an input of the current controller for the current obtained according to the first reference level signal is configured to input a sampled linearly adjusted output current; or the modulator further comprising an estimator configured to obtain a linearly adjusted output current estimation according to the first reference level signal and circuit parameters of the power supply, wherein a port of the estimator for outputting the current estimation is connected to the input of the current controller for the current obtained according to the first reference level signal.

16. The power supply modulator according to claim 15, wherein the first reference level signal is input to a load current slope estimation circuit configured to estimate a load current slope according to the first reference level signal and circuit parameters of the envelope tracking power supply to output a predicted signal of a load current change rate; wherein a port for outputting the predicted signal of the load current change rate is connected to a slope compensation control circuit configured to perform slope compensation control on the predicted signal of the load current change rate to obtain a slope compensation control signal, wherein a port for outputting the slope compensation control signal is connected to the level selection controller configured to output the second control signal according to the result of the comparison, the first control signal and the slope compensation control signal.

17. The power supply modulator according to claim 15, wherein an output of the linear regulator is connected in series with a high-pass filter and further connected in parallel with the multi-level switch regulator through the inductor.

18. The modulator according to claim 15, wherein an output of the linear regulator is connected with a low-pass filter outputting a low-frequency signal of the sampled linearly adjusted output current signal, wherein a port of the low-pass filter for outputting the low-frequency signal of current is connected with the multi-level switch regulator, the multi-level switch regulator is further configured to control the output inductive current with the sampled linearly adjusted output current signal after low-pass filtering.

* * * * *